United States Patent
Togashi

(10) Patent No.: US 8,212,152 B2
(45) Date of Patent: Jul. 3, 2012

(54) ELECTRONIC DEVICE

(75) Inventor: Masaaki Togashi, Tokyo (JP)

(73) Assignee: TDK Corporation, Tokyo (JP)

( * ) Notice: Subject to any disclaimer, the term of this patent is extended or adjusted under 35 U.S.C. 154(b) by 259 days.

(21) Appl. No.: 12/390,856

(22) Filed: Feb. 23, 2009

(65) Prior Publication Data

US 2009/0266595 A1    Oct. 29, 2009

(30) Foreign Application Priority Data

Apr. 28, 2008  (JP) ................. 2008-117272

(51) Int. Cl.
*H05K 1/16* (2006.01)
(52) U.S. Cl. ..................................... 174/260
(58) Field of Classification Search .......... 174/255, 174/261, 262; 361/704, 792–795
See application file for complete search history.

(56) References Cited

U.S. PATENT DOCUMENTS

| | | | | |
|---|---|---|---|---|
| 6,336,365 | B1 * | 1/2002 | Blackadar et al. | 73/514.34 |
| 7,446,262 | B2 * | 11/2008 | Ogawa et al. | 174/255 |
| 7,619,168 | B2 | 11/2009 | Togashi | |
| 2006/0028785 | A1 * | 2/2006 | Togashi et al. | 361/321.2 |

FOREIGN PATENT DOCUMENTS

| | | |
|---|---|---|
| JP | U-60-57152 | 4/1985 |
| JP | U-63-180963 | 11/1988 |
| JP | U-5-95074 | 12/1993 |
| JP | U-07-007165 | 1/1995 |
| JP | A-9-181403 | 7/1997 |
| JP | A-2000-232030 | 8/2000 |
| JP | A-2007-53248 | 3/2007 |

OTHER PUBLICATIONS

Machine Translation of JP-U-05-095074, Dec. 24, 1993.*
Machine Translation of JP-U-07-007165, Jan. 31, 1995.*
Translation of Apr. 13, 2010 Office Action issued in Japanese Patent Application No. P2008-117272.
Translation of Japanese Office Action issued in Japanese Patent Application No. 2008-117272 dated Nov. 9, 2010.

* cited by examiner

*Primary Examiner* — Jeremy Norris
*Assistant Examiner* — Tremesha S Willis
(74) *Attorney, Agent, or Firm* — Oliff & Berridge, PLC

(57) ABSTRACT

An electronic device has a multilayer capacitor and a circuit board on which the capacitor is mounted. The capacitor is formed in a nearly rectangular parallelepiped shape and has a first terminal electrode and a second terminal electrode arranged at respective ends thereof. On the circuit board there are a first land to which the first terminal electrode of the capacitor is fixed and a second land to which the second terminal electrode is fixed. The circuit board has a slit formed so as to open on the second land side and surround the first land, when viewed from a direction perpendicular to a principal surface of the circuit board. An imaginary straight line connecting one end and the other end of the slit intersects with the capacitor when viewed from the direction perpendicular to the principal surface of the circuit board.

8 Claims, 10 Drawing Sheets

ELECTRONIC DEVICE

BACKGROUND OF THE INVENTION

1. Field of the Invention

The present invention relates to an electronic device having a circuit board and a multilayer capacitor.

2. Related Background Art

A multilayer capacitor has internal electrode layers and dielectric layers alternately stacked therein. When an ac voltage is applied to this capacitor, the dielectric layers vibrate by virtue of the piezoelectric phenomenon. For this reason, the vibration of the capacitor is transferred to the circuit board on which the capacitor is mounted, so that the circuit board can vibrate to produce audible sound. As a technique to prevent the vibration of the circuit board, Japanese Patent Application Laid-open No. 2000-232030 describes the technique of arranging two capacitors as opposed to each other with the board in between and canceling out vibrations transferred from the respective capacitors to the circuit board.

SUMMARY OF THE INVENTION

However, the technique described in Japanese Patent Application Laid-open No. 2000-232030 requires the capacitors to be mounted on both sides of the board, increases the number of parts, and makes the structure complicated.

An object of the present invention is therefore to provide an electronic device capable of relieving the vibration of the circuit board due to the capacitor by a simpler structure.

The present invention provides an electronic device comprising: a multilayer capacitor formed in a nearly rectangular parallelepiped shape and having a first terminal electrode and a second terminal electrode arranged at respective ends thereof; and a circuit board having a first land and a second land arranged thereon, in which the first terminal electrode of the capacitor is fixed to the first land and in which the second terminal electrode is fixed to the second land, wherein the circuit board has a slit formed so as to open on the second land side and surround the first land, when viewed from a direction perpendicular to a principal surface of the circuit board, and wherein an imaginary straight line connecting one end and the other end of the slit intersects with the capacitor when viewed from the direction perpendicular to the principal surface of the circuit board.

In the present invention, the slit opening on the second land side and surrounding the first land is formed in the circuit board and the imaginary straight line connecting one end and the other end of the slit intersects with the capacitor when viewed from the direction perpendicular to the principal surface of the circuit board. For this reason, a region surrounded by the slit and the imaginary straight line in the circuit board is more likely to vibrate than the other region of the circuit board. Therefore, the vibration of the capacitor is transferred through the first land surrounded by the slit, mainly to the region surrounded by the slit and the imaginary straight line in the circuit board, whereby the surrounded region vibrates. According to the present invention, the slit makes the vibration unlikely to be transmitted from the region surrounded by the slit and the imaginary straight line in the circuit board, to the other region, whereby the vibration is prevented from being transferred to the other region of the circuit board. This structure can relieve the vibration of the circuit board due to the capacitor accordingly. The vibration of the circuit board is thus relieved by the simple structure in which the slit is provided in the circuit board.

Preferably, when viewed from the direction perpendicular to the principal surface of the circuit board, the slit has a first portion located on the side opposite to the second land with respect to the first land, and second and third portions located so as to sandwich the first land in a direction perpendicular to a facing direction of the first terminal electrode and the second terminal electrode. In this case, the first to third portions constitute the slit so as to open on the second land side and appropriately surround the first land.

Preferably, the slit is formed so that the first portion is continuous to the second and third portions. In this case, since the first to third portions are continuously formed, the region surrounded by the slit and the imaginary straight line is made more likely to vibrate.

Preferably, the electronic device comprises a plurality of capacitors; the plurality of capacitors are juxtaposed so that the facing directions of the first terminal electrode and the second terminal electrode thereof are parallel to each other; the circuit board has a first region in which there are the first lands arranged in a number corresponding to a number of capacitors, and a second region in which there are the second lands arranged in a number corresponding to the number of capacitors; the slit is formed so as to open on the second region side and surround the first region, when viewed from the direction perpendicular to the principal surface of the circuit board; the imaginary straight line intersects with the plurality of capacitors when viewed from the direction perpendicular to the principal surface of the circuit board.

In this case, the slit opening on the second region side and surrounding the first region is formed in the circuit board and the imaginary straight line connecting one end and the other end of the slit intersects with the plurality of capacitors when viewed from the direction perpendicular to the principal surface of the circuit board. For this reason, the region surrounded by the slit and the imaginary straight line in the circuit board is more likely to vibrate than the other region of the circuit board. Therefore, vibration of each capacitor is transferred through the first land surrounded by the slit, mainly to the first region, whereby the first region vibrates. The slit makes the vibration unlikely to be transmitted from the first region to the other region of the circuit board (the second region and others), whereby the vibration is prevented from being transferred to the other region of the circuit board. This structure relieves the vibration of the circuit board due to each capacitor accordingly.

Preferably, when viewed from the direction perpendicular to the principal surface of the circuit board, the slit has a first portion located on the side opposite to the second region with respect to the first region, and second and third portions located so as to sandwich the first region in a direction perpendicular to the facing directions of the first terminal electrode and the second terminal electrode. In this case, the first to third portions constitute the slit so as to open on the second region side and appropriately surround the first region.

Preferably, the slit is formed so that the first portion is continuous to the second and third portions. In this case, since the first to third portions are continuously formed, the region surrounded by the slit and the imaginary straight line is made more likely to vibrate.

Preferably, the slit is formed so as to extend between the first lands adjacent to each other. In this case, since each first land to vibrate is isolated from the others, this structure prevents the vibration from being amplified by vibration of the first lands. For this reason, this structure further relieves the vibration of the circuit board due to the capacitors.

Preferably, the slit is discontinuously formed, and the circuit board has a conductor pattern arranged thereon, the conductor pattern being electrically connected to the first land and passing a discontinuous portion of the slit. This structure permits the conductor pattern to be efficiently arranged and the slit to be effectively arranged.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference symbols, without redundant description.

First Embodiment

Figure 1:
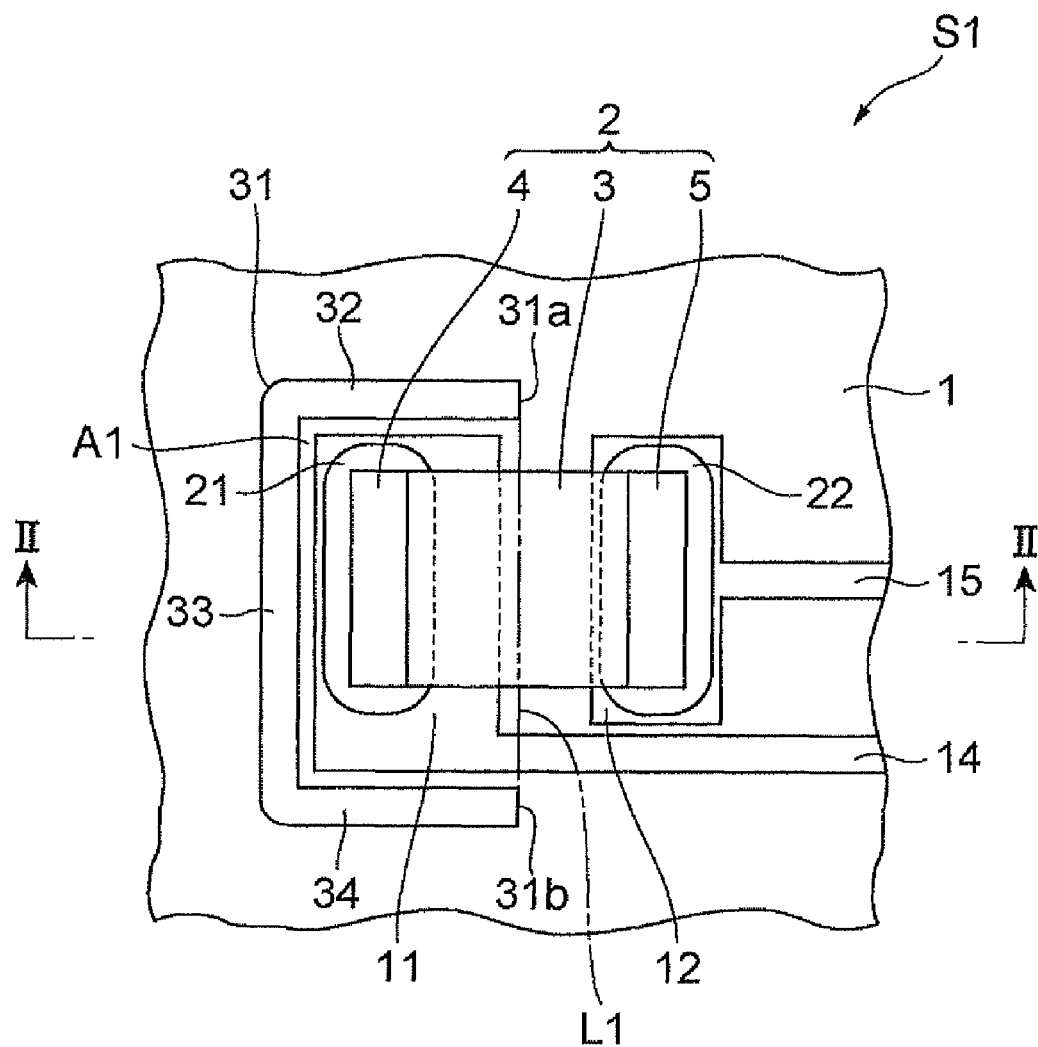
FIG. 1 is a plan view showing an electronic device according to the first embodiment.
Figure 2:
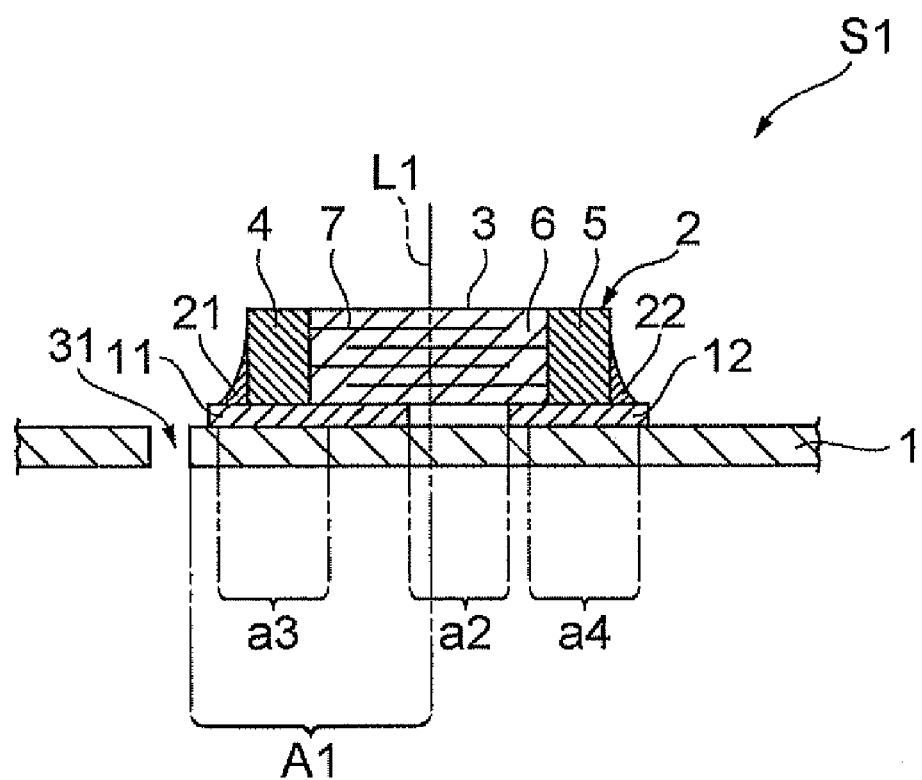
FIG. 2 is a sectional view along line II-II in FIG. 1.

FIG. 1 is a plan view showing an electronic device according to the first embodiment. FIG. 2 is a sectional view along line II-II in FIG. 1. The electronic device S1 of the present embodiment has a circuit board 1, and a multilayer capacitor 2 mounted on the circuit board 1. The circuit board 1 is a resin substrate made of epoxy resin or the like, the thickness of which is approximately 1 mm.

The capacitor 2 is a multilayer ceramic capacitor. The capacitor 2 has an element body 3 of a nearly rectangular parallelepiped shape, and a first terminal electrode 4 and a second terminal electrode 5 arranged at respective ends of the element body 3. The capacitor 2 is dimensioned in a rectangular parallelepiped shape the length of each side of which is approximately 2-3 mm.

The element body 3 has a plurality of dielectric layers 6 and a plurality of internal electrode layers 7 alternately laminated in a facing direction of two side faces. The plurality of internal electrode layers 7 consist of internal electrode layers 7 electrically connected to the first terminal electrode 4 and internal electrode layers 7 electrically connected to the second terminal electrode 5, which are alternately arranged. The first terminal electrode 4 covers the entire area of one end face of the element body 3 and covers regions of the four side faces of the element body 3 on the one end face side. The second terminal electrode 5 covers the entire area of the other end face of the element body 3 and covers regions of the four side faces of the element body 3 on the other end face side.

On the circuit board 1 there are a first land 11 and a second land 12 arranged so as to be formed on one surface of the circuit board 1. The first land 11 and the second land 12 are formed each in a nearly rectangular shape and are separately arranged so that their longitudinal directions are parallel to each other. The capacitor 2 is arranged on the circuit board 1 so that the direction in which the first land 11 and the second land 12 are separated becomes approximately parallel to the facing direction of the first terminal electrode 4 and the second terminal electrode 5.

The first terminal electrode 4 is fixed to the first land 11 by solder 21, whereby the first terminal electrode 4 is electrically connected thereto. The solder 21 mainly secures the portion of the first terminal electrode 4 formed on one side face of the element body 3, to the circuit board 1 and secures the first terminal electrode 4 to the first land 11 around the circumference thereof. The second terminal electrode 5 is fixed to the second land 12 by solder 22, whereby the second terminal electrode 5 is electrically connected thereto. The solder 22 mainly secures the portion of the second terminal electrode 5 formed on one side face of the element body 3, to the circuit board 1 and secures the second terminal electrode 5 to the second land 12 around the circumference thereof.

On the circuit board 1 there are a conductor pattern 14 and a conductor pattern 15 of a linear shape arranged. The conductor pattern 14 is led from the side of one short side of the first land 11 in parallel to the short sides to the side of second land 12. The conductor pattern 15 is led from a central region of the outside long side of the second land 12 in parallel to the short sides thereof.

A slit 31 opening on the second land 12 side and surrounding the first land 11 in an approximate C-shape is formed in the circuit board 1. The slit 31 penetrates the circuit board 1 in the thickness direction. The slit 31 has a straight-line portion 32 formed on the side of one short side of the first land 11 so as to be parallel to the one short side, a straight-line portion 33 formed on the side of one long side of the first land 11 (the long side opposite to the long side facing the second land 12) so as to be parallel to the one long side, and a straight-line portion 34 formed on the side of the other short side of the first land 11 so as to be parallel to the other short side.

The straight-line portion 33 is located on the side opposite to the second land 12 with respect to the first land 11, when viewed from the direction perpendicular to the principal surface of the circuit board 1. The straight-line portion 32 is located apart from the one short side of the first land 11 in a direction substantially perpendicular to the facing direction of the first terminal electrode 4 and the second terminal electrode 5 (the direction in which the first land 11 and the second land 12 are separated). The straight-line portion 34 is located apart from the other short side of the first land 11 in the direction substantially perpendicular to the facing direction of the first terminal electrode 4 and the second terminal electrode 5. Namely, the straight-line portion 32 and the straight-line portion 34 are located so as to sandwich the first land 11 in the direction substantially perpendicular to the facing direction of the first terminal electrode 4 and the second terminal electrode 5, when viewed from the direction perpendicular to the principal surface of the circuit board 1. The slit 31 is constructed in an approximate C-shape so that the straight-line portions 32, 33, and 34 are continuous.

One end 31a of the slit 31 (the end of the straight-line portion 32 on the second land 12 side) and the other end 31b of the slit 31 (the end of the straight-line portion 34 on the second land 12 side) are located at the same position in the facing direction of the first terminal electrode 4 and the second terminal electrode 5 (the horizontal direction in FIG. 1), and between the first land 11 and the second land 12 in the facing direction of the first terminal electrode 4 and the second terminal electrode 5. An imaginary straight line L1 connecting the one end 31a and the other end 31b of the slit 31 intersects with the capacitor 2 when viewed from the direction perpendicular to the principal surface of the circuit board 1. Namely, the slit 31 does not extend as far as the second land 12 side and no slit is formed around the second land 12. No slit is formed between the first land 11 and the second land 12.

When viewed from the direction perpendicular to the principal surface of the circuit board 1, the imaginary straight line L1 passes between the two end faces of the capacitor 2 and is located on a straight line parallel to these two end faces. The imaginary straight line L1, as shown in FIG. 2, is parallel to the longitudinal direction of the first land 11 and the second land 12 and passes a region a2 between the first land 11 and the second land 12. The imaginary straight line L1 passes between a region a3 where the first terminal electrode 4 is fixed to the circuit board 1 (the region on which the solder 21 is applied) and a region a4 where the second terminal electrode 5 is fixed to the circuit board 1 (the region on which the solder 22 is applied).

The circuit board 1 described above is used, for example, as a circuit board of a plasma display panel television, and an ac voltage of about 100 V is applied thereto. When the ac voltage is applied to a circuit formed on the circuit board 1, the dielectric layers 6 of the capacitor 2 expand and contract in the facing direction of the first terminal electrode 4 and the second terminal electrode 5, whereby the capacitor 2 vibrates. The first terminal electrode 4 and the second terminal electrode 5 of the capacitor 2 are fixed to the first land 11 and to the second land 12, respectively.

In the circuit board 1, the slit 31 is formed in the approximate C-shape so as to open on the second land 12 side and surround the first land 11 and the imaginary straight line L1 connecting the one end 31a and the other end 31b of the slit 31 intersects with the capacitor 2 when viewed from the direction perpendicular to the principal surface of the circuit board 1. For this reason, a region A1 surrounded by the slit 31 and the imaginary straight line L1 in the circuit board 1 is more likely to vibrate than the other region of the circuit board 1. The vibration of the capacitor 2 is transferred mainly to the region A1 in the circuit board 1.

In the circuit board 1, the region A1 vibrates up and down (in the direction perpendicular to the principal surface of the circuit board 1) with the imaginary straight line L1 side being a fixed end and with the side opposite to the imaginary straight line L1 being a free end. Since the mainly vibrating portion in the region A1 is isolated from the other region of the circuit board 1 by the slit 31, the vibration of the region A1 is prevented from being transferred to the region around the region A1. Therefore, this structure relieves the transfer of the vibration of the capacitor 2 to the circuit board 1. As a consequence, this structure prevents production of audible sound (occurrence of sounding) due to the vibration of the circuit board 1.

In the present embodiment, the first land 11 and the region a3 where the first terminal electrode 4 is fixed to the circuit board 1, are located within the region A1. The second land 12 and the region a4 where the second terminal electrode 5 is fixed to the circuit board 1, are located outside the region A1. For this reason, the capacitor 2 is so arranged that the second terminal electrode 5 is fixed to the other region of the circuit board 1 and that the first terminal electrode 4 vibrates relative to the other region of the circuit board 1 and the second terminal electrode 5. Therefore, the vibration transmitted from the capacitor 2 to the region A1 in the circuit board 1 is prevented from being transferred to the region outside the region A1. The vibration transferred to the circuit board 1 is concentrated in the region A1, and thus the vibration of the circuit board 1 is relieved by the slit 31.

Another conceivable technique to relieve the vibration of the circuit board is to form the slit of the approximate C-shape in the circuit board so as to surround both of the first land and the second land. In this technique, the slit is formed so as to surround the entire region where the capacitor is arranged. In this case, a larger region including the second land as well as the first land vibrates relative to the main body of the circuit board. Furthermore, vibration is transferred to each of the region where the first land is formed and the region where the second land is formed, so as to vibrate the circuit board; these vibrations can cause resonance to make the vibration of the circuit board greater. For these reasons, the greater vibration is likely to be transferred to the main body of the circuit board.

In the electronic device S1 of the present embodiment, the slit 31 is formed in the approximate C-shape so as to open on the second land 12 side and surround the first land 11 and the imaginary straight line L1 intersects with the capacitor 2 when viewed from the direction perpendicular to the principal surface of the circuit board 1. This configuration prevents the vibration of the second terminal electrode 5 and thus prevents the vibration from being transferred from the second terminal electrode 5 to the second land 12. The first terminal electrode 4 mainly vibrates up and down and this vibration is transferred mainly to the region A1 of the circuit board 1. This prevents occurrence of resonance and reduces the vibration of the circuit board 1.

Modification examples of the first embodiment will be described below. The modification examples will be described with focus mainly on the differences from the first embodiment.

First Modification Example of First Embodiment

Figure 3:
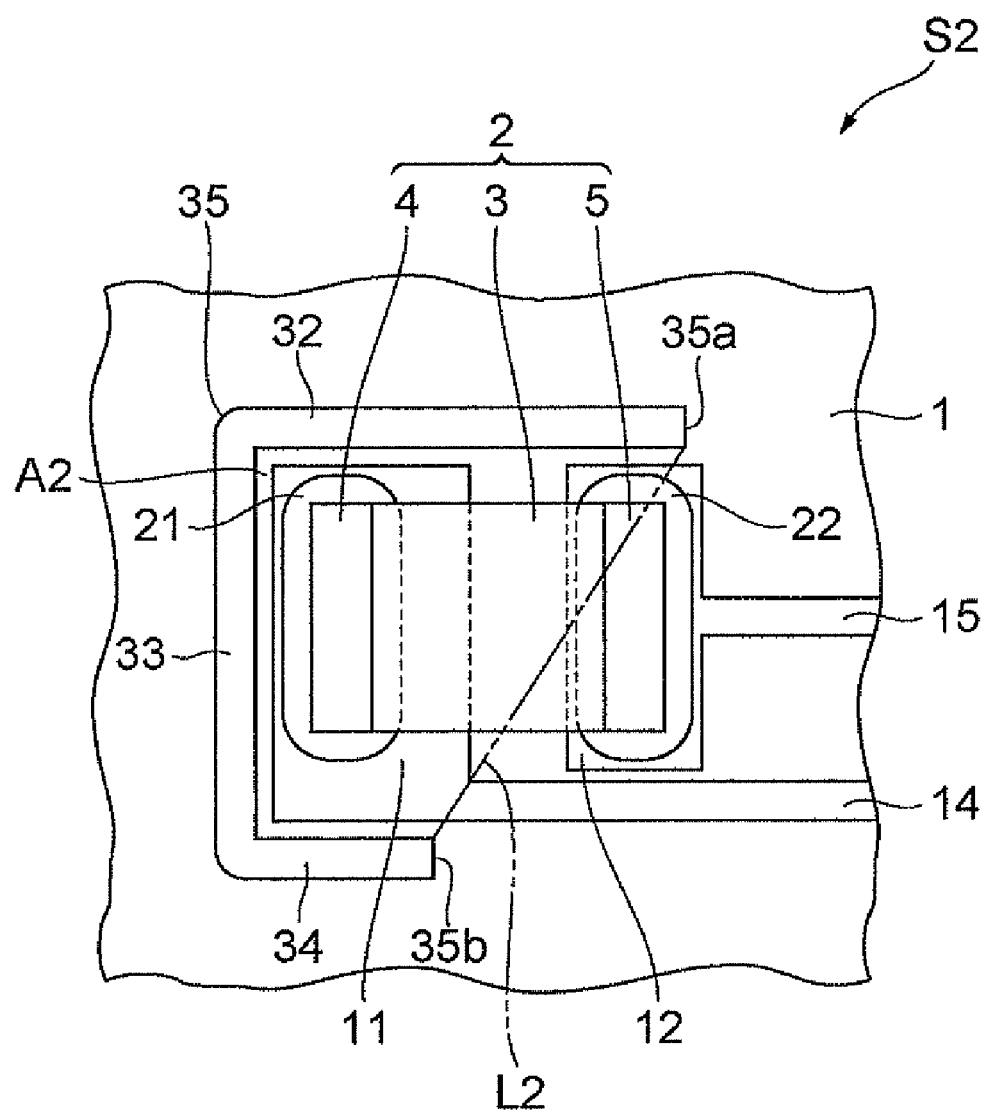
FIG. 3 is a plan view showing an electronic device according to a first modification example of the first embodiment.

FIG. 3 is a plan view showing an electronic device according to the first modification example of the first embodiment. In the electronic device S2 of the first modification example, the shape of slit 35 formed in the circuit board 1 is different from that of the slit 31 in the above-described embodiment. The slit 35 is so configured that the end of the straight-line portion 32 on the second land 12 side (one end 35a of the slit 35) reaches a region near the side of one long side (the long side opposite to the long side facing the first land 11) of the second land 12.

The straight-line portion 34 of the slit 35 is shorter than the straight-line portion 34 in the above embodiment and the end of the straight-line portion 34 on the second land 12 side (the other end 35b of the slit 35) is located on one side with respect to the other long side in the first land 11 (the long side facing the second land 12) in the facing direction of the first terminal electrode 4 and the second terminal electrode 5 (the horizontal direction in FIG. 3). An imaginary straight line L2 connecting the one end 35a and the other end 35b of the slit 35 intersects with the capacitor 2, when viewed from the direction perpendicular to the principal surface of the circuit board 1.

In the electronic device S2 of the first modification example, the slit 35 is also formed in the approximate C-shape so as to open on the second land 12 side and surround the first land 11 in the circuit board 1 and the imaginary straight line L2 connecting the one end 35a and the other end 35b of the slit 35 also intersects with the capacitor 2 when viewed from the direction perpendicular to the principal surface of the circuit board 1.

In the circuit board 1, a region A2 surrounded by the slit 35 and the imaginary straight line L2 is more likely to vibrate than the other region of the circuit board 1. The vibration of the capacitor 2 is transferred mainly to the region A2 in the circuit board 1. In the circuit board 1, the region A2 vibrates up and down with the imaginary straight line L2 side being a fixed end and with the side opposite to the imaginary straight line L2 being a free end. Since the mainly moving portion in the region A2 is isolated from the other region of the circuit board 1 by the slit 35, the vibration of the region A2 is prevented from being transferred to the region around the region A2. Therefore, this structure relieves the transfer of the vibration of the capacitor 2 to the circuit board 1. As a result, this structure prevents production of audible sound due to the vibration of the circuit board 1.

In the electronic device S2 of the first modification example, the imaginary straight line L2 passes the region between the first land 11 and the second land 12. The imaginary straight line L2 passes between the region where the first terminal electrode 4 is fixed to the circuit board 1 and the region where the second terminal electrode 5 is fixed to the circuit board 1. The first land 11 and the region where the first terminal electrode 4 is fixed to the circuit board 1, are located within the region A2. The second land 12 and the region where the second terminal electrode 5 is fixed to the circuit board 1, are partly located within the region A2, but are mostly located outside the region A2. For this reason, the capacitor 2 is so arranged that the second terminal electrode 5 is fixed to the other region of the circuit board 1 and that the first terminal electrode 4 vibrates relative to the other region of the circuit board 1 and the second terminal electrode 5. Therefore, the vibration transferred from the capacitor 2 to the region A2 in the circuit board 1 is prevented from being transferred to the region outside the region A2. The vibration transferred to the circuit board 1 is concentrated in the region A2, whereby the vibration of the circuit board 1 is relieved by the slit 35.

Second Modification Example of First Embodiment

Figure 4:
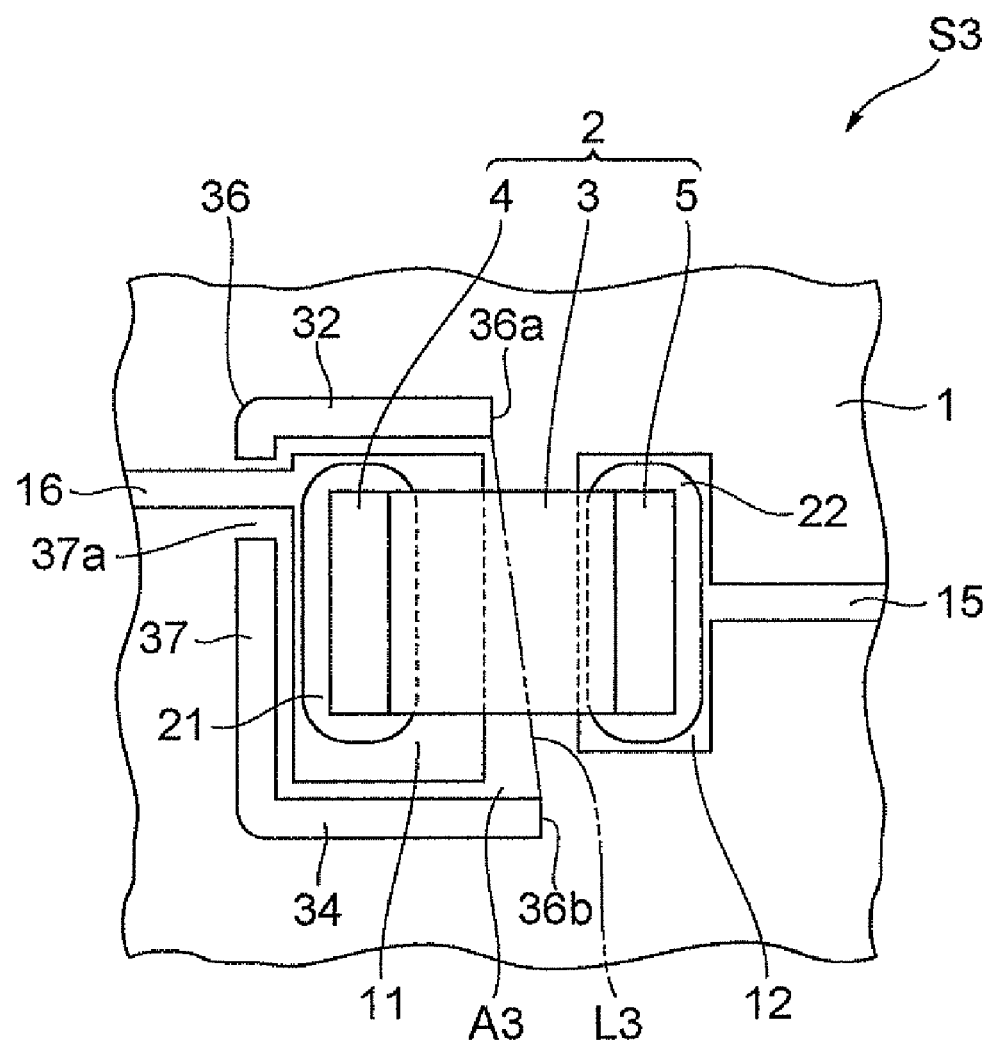
FIG. 4 is a plan view showing an electronic device according to a second modification example of the first embodiment.

FIG. 4 is a plan view showing an electronic device according to the second modification example of the first embodiment. In the electronic device S3 of the second modification example, the shape of slit 36 formed in the circuit board 1 is different from that of the slit 31 in the above embodiment. The slit 36 has a straight-line portion 37 discontinuous in part, instead of the aforementioned straight-line portion 33 parallel to the longitudinal direction of the first land 11. A disjoined portion (discontinuous portion) 37a of the straight-line portion 37 is located on the straight-line portion 32 side in the straight-line portion 37. A conductor pattern 16 led perpendicularly from one long side of the first land 11 passes on the disjoined portion 37a. The straight-line portion 34 of the slit 36 is longer than the straight-line portion 34 in the above embodiment and the end of the straight-line portion 34 on the second land 12 side (the other end 36b of the slit 36) is located approximately midway between the first land 11 and the second land 12 in the facing direction of the first terminal electrode 4 and the second terminal electrode 5 (the horizontal direction in FIG. 4). An imaginary straight line L3 connecting one end 36a and the other end 36b of the slit 36 intersects with the capacitor 2 when viewed from the direction perpendicular to the principal surface of the circuit board 1.

In the electronic device S3 of the second modification example, the slit 36 is also formed in the approximate C-shape so as to open on the second land 12 side and surround the first land 11 in the circuit board 1 and the imaginary straight line L3 connecting the one end 36a and the other end 36b of the slit 36 also intersects with the capacitor 2 when viewed from the direction perpendicular to the principal surface of the circuit board 1.

In the circuit board 1, a region A3 surrounded by the slit 36 and the imaginary straight line L3 is more likely to vibrate than the other region of the circuit board 1. The vibration of the capacitor 2 is transferred mainly to the region A3 in the circuit board 1. In the circuit board 1, the region A3 vibrates up and down with the imaginary straight line L3 side being a fixed end and with the side opposite to the imaginary straight line L3 being a free end. Since the mainly vibrating portion in the region A3 is isolated from the other region of the circuit board 1 by the slit 36, the vibration of the region A3 is prevented from being transferred to the region around the region A3. Therefore, this structure relieves the transfer of the vibration of the capacitor 2 to the circuit board 1. As a consequence, this structure prevents production of audible sound due to the vibration of the circuit board 1.

In the electronic device S3 of the second modification example, the imaginary straight line L3 passes the region between the first land 11 and the second land 12. The imaginary straight line L3 passes between the region where the first terminal electrode 4 is fixed to the circuit board 1 and the region where the second terminal electrode 5 is fixed to the circuit board 1. The first land 11 and the region where the first terminal electrode 4 is fixed to the circuit board 1 are located within the region A3. The second land 12 and the region where the second terminal electrode 5 is fixed to the circuit board 1 are located outside the region A3. For this reason, the capacitor 2 is so arranged that the second terminal electrode 5 is fixed to the other region of the circuit board 1 and that the first terminal electrode 4 vibrates relative to the other region of the circuit board 1 and the second terminal electrode 5. Therefore, the vibration transferred from the capacitor 2 to the region A3 in the circuit board 1 is prevented from being transferred to the region outside the region A3. The vibration transferred to the circuit board 1 is concentrated in the region A3, whereby the vibration of the circuit board 1 is relieved by the slit 36.

Third Modification Example of First Embodiment

Figure 5:
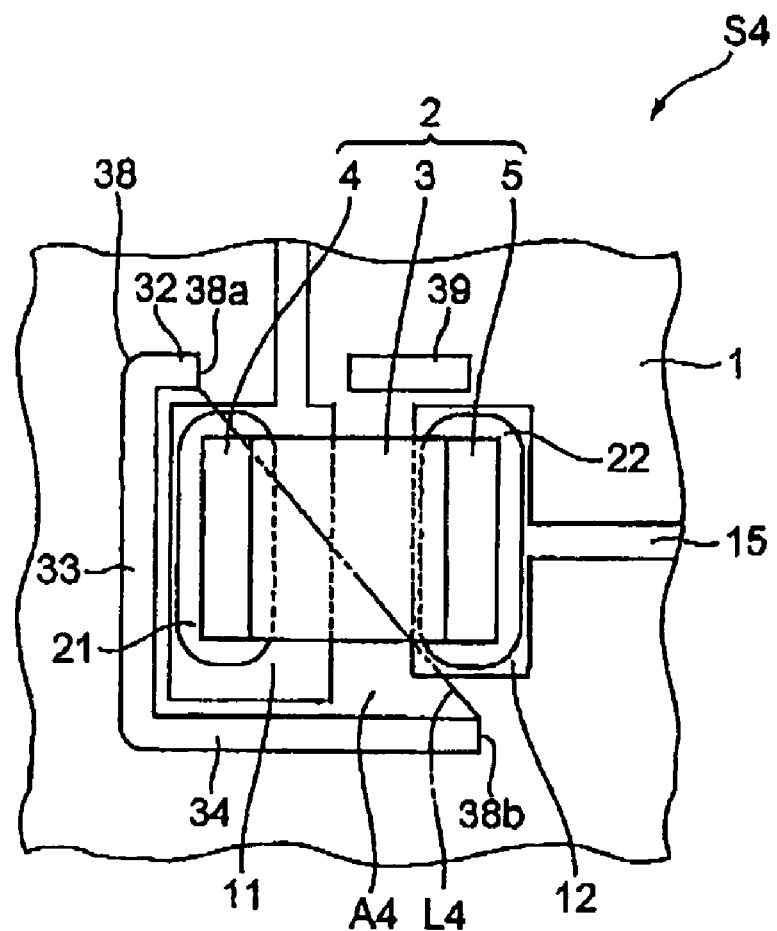
FIG. 5 is a plan view showing an electronic device according to a third modification example of the first embodiment.

FIG. 5 is a plan view showing an electronic device according to the third modification example of the first embodiment. In the electronic device S4 of the third modification example, the shape of slit 38 formed in the circuit board 1 is different from that of the slit 31 in the above embodiment. The straight-line portion 32 of the slit 38 is shorter than the straight-line portion 32 in the above embodiment. The end of the straight-line portion 32 on the second land 12 side (one end 38a of the slit 38) is located between a pair of long sides of the first land 11 in the facing direction of the first terminal electrode 4 and the second terminal electrode 5 (the horizontal direction in FIG. 5).

The straight-line portion 34 of the slit 38 is longer than the straight-line portion 34 in the above embodiment and extends to a position between a pair of long sides of the second land 12 in the facing direction of the first terminal electrode 4 and the second terminal electrode 5. Namely, the end of the straight-line portion 34 on the second land 12 side (the other end 38b of the slit 38) is located between the pair of long sides of the second land 12 in the facing direction of the first terminal electrode 4 and the second terminal electrode 5. An imaginary straight line L4 connecting the one end 38a and the other end 38b of the slit 38 intersects with the capacitor 2 when viewed from the direction perpendicular to the principal surface of the circuit board 1.

In the electronic device S4 of the third modification example, the slit 38 is also formed in the approximate C-shape so as to open on the second land 12 side and surround the first land 11 in the circuit board 1 and the imaginary straight line L4 connecting the one end 38a and the other end 38b of the slit 38 also intersects with the capacitor 2 when viewed from the direction perpendicular to the principal surface of the circuit board 1. For this reason, the region A4 surrounded by the slit 38 and the straight line L4 in the circuit board 1 is more likely to vibrate than the other region of the circuit board 1. The vibration of the capacitor 2 is transferred mainly to the region A4 in the circuit board 1.

In the circuit board 1, the region A4 vibrates up and down with the imaginary straight line L4 side being a fixed end and with the side opposite to the imaginary straight line L4 being a free end. Since the mainly vibrating portion in the region A4 is isolated from the other region of the circuit board 1 by the slit 38, the vibration of the region A4 is prevented from being transferred to the region around the region A4. Therefore, this structure relieves the transfer of the vibration of the capacitor 2 to the circuit board 1. As a result, this structure prevents production of audible sound due to the vibration of the circuit board 1.

In the electronic device S4 of the third modification example, the imaginary straight line L4 passes the region between the first land 11 and the second land 12. The imaginary straight line L4 passes between the region where the first terminal electrode 4 is fixed to the circuit board 1 and the region where the second terminal electrode 5 is fixed to the circuit board 1. The first land 11 and the region where the first terminal electrode 4 is fixed to the circuit board 1 are mostly located in the region A4. The second land 12 and the region where the second terminal electrode 5 is fixed to the circuit board 1 are mostly located outside the region A4. For this reason, the capacitor 2 is so arranged that the second terminal electrode 5 is fixed to the other region of the circuit board 1 and that the first terminal electrode 4 vibrates relative to the other region of the circuit board 1 and the second terminal electrode 5. Therefore, this structure prevents the vibration transferred from the capacitor 2 to the region A4 in the circuit board 1 from being transferred to the region outside the region A4. The vibration transferred to the circuit board 1 is concentrated in the region A4, whereby the vibration of the circuit board 1 is relieved by the slit 38.

In the circuit board 1, a slit 39 of a linear shape extending in a direction nearly parallel to the short sides of the first and second lands 11, 12 is further formed. In the facing direction of the first terminal electrode 4 and the second terminal electrode 5, one end of the slit 39 is located between the first land 11 and the second land 12 and the other end of the slit 39 is located approximately in the center of one short side of the second land 12. The slit 39 prevents the vibration of the region A4 from being transferred from the fixed end side (imaginary straight line L4) to the region where the second land 12 is formed, and further prevents the vibration from being transferred to the wide range of the circuit board 1.

Fourth Modification Example of First Embodiment

Figure 6:
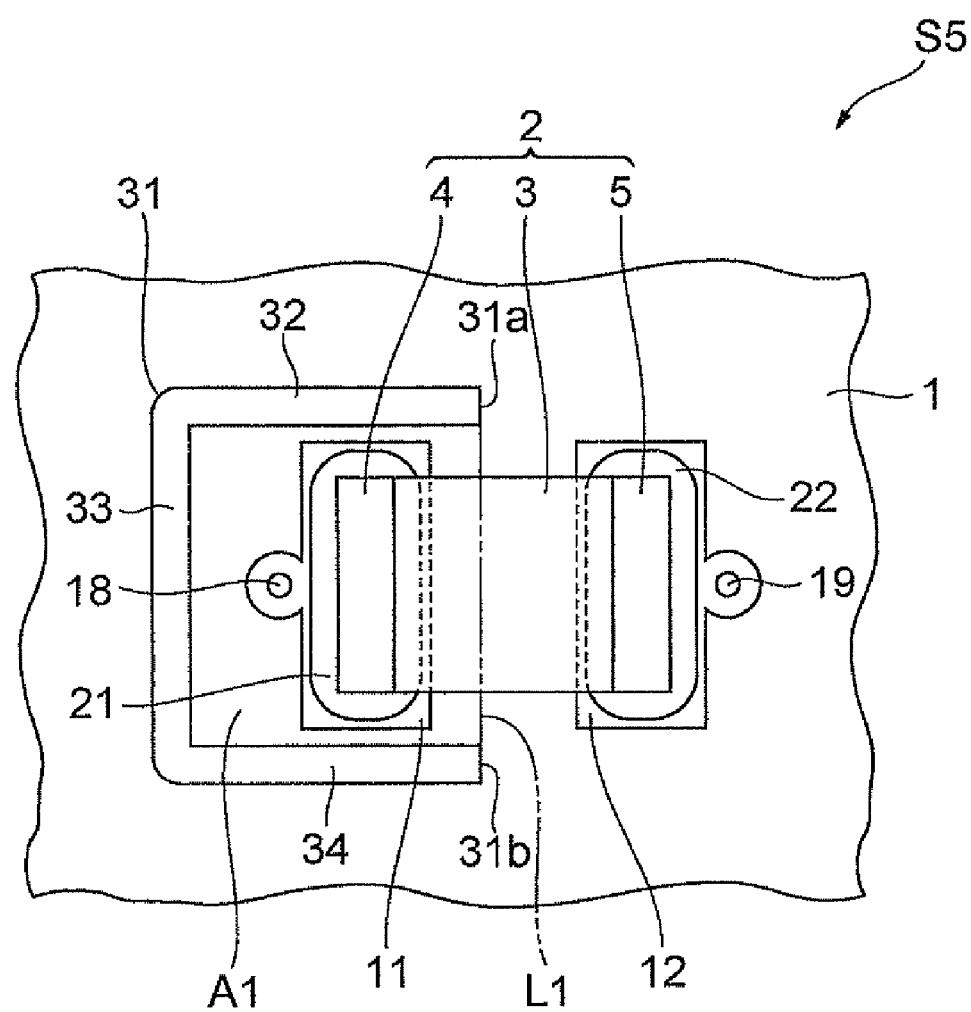
FIG. 6 is a plan view showing an electronic device according to a fourth modification example of the first embodiment.

FIG. 6 is a plan view showing an electronic device according to the fourth modification example of the first embodiment. In the electronic device S5 of the fourth modification example, through conductors 18, 19 are arranged, instead of the aforementioned conductor patterns 14, 15, in the circuit board 1. The through conductors 18, 19 are conductors penetrating the circuit board 1 in the thickness direction. The through conductor 18 is formed in the central region on the side of one long side of the first land 11 and is electrically connected to the first land 11. The through conductor 19 is formed in the central region on the side of one long side of the second land 12 and is electrically connected to the second land 12.

In the electronic device S5 of the fourth modification example, similar to the electronic device S1 of the first embodiment, the slit 31 is also formed in the approximate C-shape so as to open on the second land 12 side and surround the first land 11 in the circuit board 1 and the imaginary straight line L1 connecting one end 31a and the other end 31b of the slit 31 also intersects with the capacitor 2 when viewed from the direction perpendicular to the principal surface of the circuit board 1. For this reason, this structure relieves the transfer of the vibration of the capacitor 2 to the circuit board 1.

Second Embodiment

Figure 7:
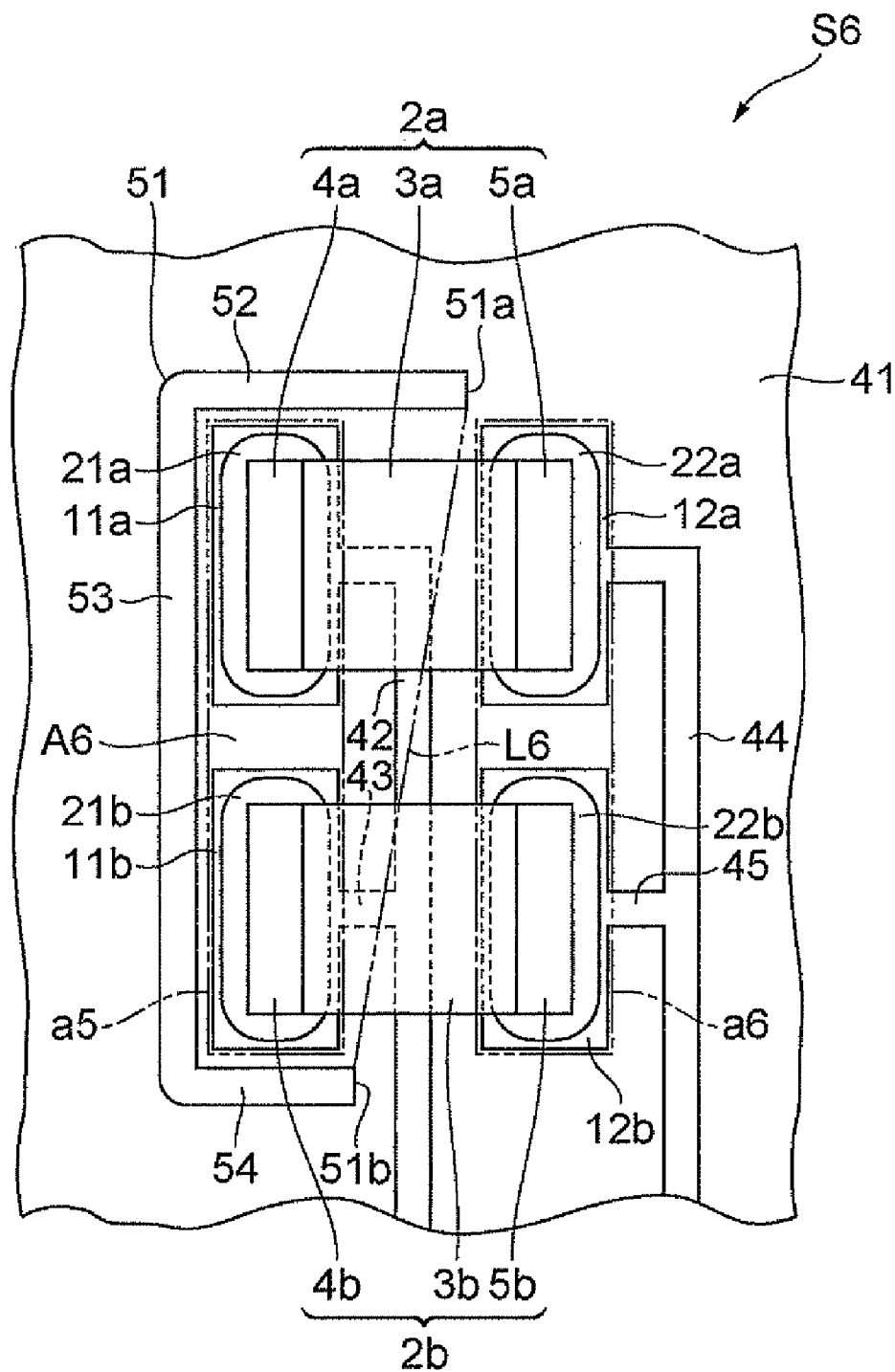
FIG. 7 is a plan view showing an electronic device according to the second embodiment.

FIG. 7 is a plan view showing an electronic device according to the second embodiment. The electronic device S6 of the second embodiment has a circuit board 41, and a plurality of capacitors 2a, 2b (two capacitors in the present embodiment) mounted on the circuit board 41. The plurality of capacitors 2a, 2b have the same configuration as the aforementioned capacitor 2 and each has an element body 3a or 3b of a rectangular parallelepiped shape, and a first terminal electrode 4a or 4b and a second terminal electrode 5a or 5b arranged at respective ends thereof.

The capacitor 2a and the capacitor 2b are so arranged on the circuit board 41 that the facing direction of the first terminal electrode 4a and the second terminal electrode 5a of the capacitor 2a is parallel to the facing direction of the first terminal electrode 4b and the second terminal electrode 5b of the capacitor 2b. The capacitor 2a and the capacitor 2b are so arranged that their one end faces and other end faces are aligned with each other.

A first land 11a and a second land 12a are arranged on the circuit board 41 so as to correspond to the first terminal electrode 4a and the second terminal electrode 5a, respectively, of the capacitor 2a. A first land 11b and a second land 12b are arranged on the circuit board 41 so as to correspond to the first terminal electrode 4b and the second terminal electrode 5b, respectively, of the capacitor 2b.

The first lands 11a, 11b and the second lands 12a, 12b are formed in a nearly rectangular shape. On the circuit board 41, the two first lands 11a, 11b and the two second lands 12a, 12b are arrayed vertically and horizontally. The facing direction of the first land 11a and the second land 12a, the facing direction of the first land 11b and the second land 12b, and the short sides of the first and second lands 11a, 11b, 12a, 12b are set to be approximately parallel to each other.

The first terminal electrodes 4a, 4b of the capacitors 2a, 2b are fixed to the first lands 11a, 11b, respectively, by respective solders 21a, 21b, whereby the first terminal electrodes 4a, 4b are electrically connected thereto. The second terminal electrodes 5a, 5b of the capacitors 2a, 2b are fixed to the second lands 12a, 12b, respectively, by respective solders 22a, 22b, whereby the second terminal electrodes 5a, 5b are electrically connected thereto.

A conductor pattern 42 and a conductor pattern 43 are arranged on the circuit board 41. The conductor pattern 42 is so formed in an approximate L-shape that it is led from almost the center of the other long side of the first land 11a (the long side facing the second land 12a) in the direction perpendicular to the long side and then extends toward the side of first land 11b in the direction parallel to the long side. The conductor pattern 43 is so formed in a nearly linear shape that it is led from almost the center of the other long side of the first land 11b (the long side facing the second land 12b) in the direction perpendicular to the long side. The conductor pattern 43 is connected to the conductor pattern 42.

A conductor pattern 44 and a conductor pattern 45 are arranged on the circuit board 41. The conductor pattern 44 is so formed in an approximate L-shape that it is led from almost the center of the other long side of the second land 12a (the long side opposite to the long side facing the first land 11a) in the direction perpendicular to the long side and then extends toward the side of second land 12b in the direction parallel to the long side. The conductor pattern 45 is so formed in a nearly linear shape that it is led from almost the center of the other long side of the second land 12b (the long side opposite to the long side facing the first land 11b) in the direction perpendicular to the long side. The conductor pattern 45 is connected to the conductor pattern 44.

By these conductor patterns 42-45, the first land 11a is electrically connected to the first land 11b and the second land 12a is electrically connected to the second land 12b. Namely, the capacitor 2a and the capacitor 2b are connected in parallel.

In the circuit board 41, a slit 51 is formed so as to open on the side of region a6 where the two second lands 12a, 12b are arranged and surround a region a5 where the two first lands 11a, 11b are arranged, in an approximate C-shape. The slit 51 penetrates the circuit board 41 in the thickness direction. The slit 51 has a straight-line portion 52 formed on the side of one short side of the first land 11a so as to be parallel to the one short side, a straight-line portion 53 formed on the side of one long sides of the first lands 11a, 11b (the long sides opposite to the long sides facing the second lands 12a, 12b) so as to be parallel to the long sides, and a straight-line portion 54 formed on the side of the other short side of the first land 11b so as to be parallel to the other short side.

The straight-line portion 53 is located on the side opposite to the region a6 with respect to the region a5, when viewed from the direction perpendicular to the principal surface of the circuit board 1. The straight-line portion 52 is located apart from the region a5 in the direction perpendicular to the facing direction of the first terminal electrodes 4a, 4b and the second terminal electrodes 5a, 5b (the direction in which the first lands 11 are separated from the second lands 12). The straight-line portion 54 is located apart from the region a5 in the direction perpendicular to the facing direction of the first terminal electrodes 4a, 4b and the second terminal electrodes 5a, 5b. The slit 51 is constructed in an approximate C-shape so that the straight-line portions 52, 53, and 54 are continuously formed.

There is no slit formed between each pair of the first and second lands 11a, 11b, 12a, 12b and no slit formed around the second lands 12a, 12b. One end 51a of the slit 51 (the end of the straight-line portion 52 on the second land 12a side) reaches a region near the other long side of the second land 12a in the facing direction of the first terminal electrode 4a, 4b and the second terminal electrode 5a, 5b (the horizontal direction in FIG. 7). The other end 51b of the slit 51 (the end of the straight-line portion 54 on the second land 12b side) reaches a region near the other long side of the first land 11b in the facing direction of the first terminal electrode 4a, 4b and the second terminal electrode 5a, 5b. An imaginary straight line L6 connecting the one end 51a and the other end 51b of the slit 51 intersects with the two capacitors 2a, 2b, when viewed from the direction perpendicular to the principal surface of the circuit board 41.

When an ac voltage is applied to a circuit formed on the circuit board 41, the two capacitors 2a, 2b expand and contract in the facing direction of the first terminal electrodes 4a, 4b and the second terminal electrodes 5a, 5b, whereby each capacitor vibrates. Since the first terminal electrodes 4a, 4b and the second terminal electrodes 5a, 5b are fixed to the first lands 11a, 11b and to the second lands 12a, 12b, respectively, the vibration of the capacitors 2a, 2b is transferred to the circuit board 41.

In the circuit board 41, the slit 51 is formed in the approximate C-shape so as to open on the region a6 side where the two second lands 12a, 12b are formed and surround the region a5 where the two first lands 11a, 11b are formed, and the imaginary straight line L6 connecting the one end 51a and the other end 51b of the slit 51 intersects with the two capacitors 2a, 2b when viewed from the direction perpendicular to the principal surface of the circuit board 41. For this reason, a region A6 surrounded by the slit 51 and the imaginary straight line L6 in the circuit board 41 is more likely to vibrate than the other region of the circuit board 41. The vibration of the capacitors 2a, 2b is transferred mainly to the region A6 in the circuit board 41.

In the circuit board 41, the region A6 vibrates up and down with the imaginary straight line L6 side being a fixed end and with the side opposite to the imaginary straight line L6 being a free end. Since the mainly vibrating portion in the region A6 is isolated from the other region of the circuit board 41 by the slit 51, the vibration of the region A6 is prevented from being transferred to the region around the region A6. Therefore, this structure relieves the transfer of the vibration of the capacitors 2a, 2b to the circuit board 41. As a result, this structure prevents production of audible sound due to the vibration of the circuit board 41.

When viewed from the direction perpendicular to the principal surface of the circuit board 41, the imaginary straight line L6 passes between the two end faces of the capacitor 2a and passes between the two end faces of the capacitor 2b. The imaginary straight line L6 passes the region between the first land 11a and the second land 12a and the region between the first land 11b and the second land 12b. The imaginary straight line L6 passes between the region where the first terminal electrode 4a is fixed to the circuit board 41 (the region on which the solder 21a is applied) and the region where the second terminal electrode 5a is fixed to the circuit board 41 (the region on which the solder 22a is applied). The imaginary straight line L6 passes between the region where the first terminal electrode 4b is fixed to the circuit board 41 (the region on which the solder 21b is applied) and the region where the second terminal electrode 5b is fixed to the circuit board 41 (the region on which the solder 22b is applied).

The first lands 11a, 11b and the regions where the first terminal electrodes 4a, 4b are fixed to the circuit board 41 are located within the region A6. The second lands 12a, 12b and the regions where the second terminal electrodes 5a, 5b are fixed to the circuit board 41 are located outside the region A6. For this reason, the capacitors 2a, 2b are so arranged that the second terminal electrodes 5a, 5b are fixed to the other region of the circuit board 41 and that the first terminal electrodes 4a, 4b vibrate relative to the other region of the circuit board 41 and the second terminal electrodes 5a, 5b. Therefore, the vibration transferred from the capacitors 2a, 2b to the circuit board 41 is prevented from being transferred to the region outside the region A6. The vibration transferred to the circuit board 41 is concentrated in the region A6, whereby the vibration of the circuit board 41 is relieved by the slit 51.

Another conceivable technique to relieve the vibration of the circuit board is to form a slit of an approximate C-shape in the board so as to surround all of the two first lands and the two second lands. In this technique, the slit is formed so as to surround the region where the two capacitors are arranged. In this case, a larger region including the two second lands as well as the two first lands vibrates relative to the main body of the circuit board. Furthermore, vibration is transferred to each of the regions where the two first lands are formed and to the regions where the two second lands are formed, so as to vibrate the circuit board; therefore, these vibrations can cause resonance to amplify the vibration. For these reasons, greater vibration becomes likely to be transferred to the main body of the circuit board.

In the electronic device S6 of the present embodiment, the slit 51 is formed in the approximate C-shape so as to open on the side of the region a6 where the two second lands 12a, 12b are formed and surround the region a5 where the two first lands 11a, 11b are formed, and the imaginary straight line L6 connecting the one end 51a and the other end 51b of the slit 51 intersects with the two capacitors 2a, 2b when viewed from the direction perpendicular to the principal surface of the circuit board 41. This configuration suppresses the vibration of the second terminal electrodes 5a, 5b and prevents the vibration from being transferred from the second terminal electrodes 5a, 5b to the second lands 12a, 12b. The first terminal electrodes 4a, 4b mainly vibrate up and down and this vibration is transferred to the circuit board 41. In the circuit board 41, the vibrating region A6 is specified in a smaller area. For these reasons, occurrence of resonance is suppressed, so as to reduce the vibration of the circuit board 41.

Modification examples of the second embodiment will be described below. The modification examples will be explained with focus mainly on the differences from the second embodiment.

First Modification Example of Second Embodiment

Figure 8:
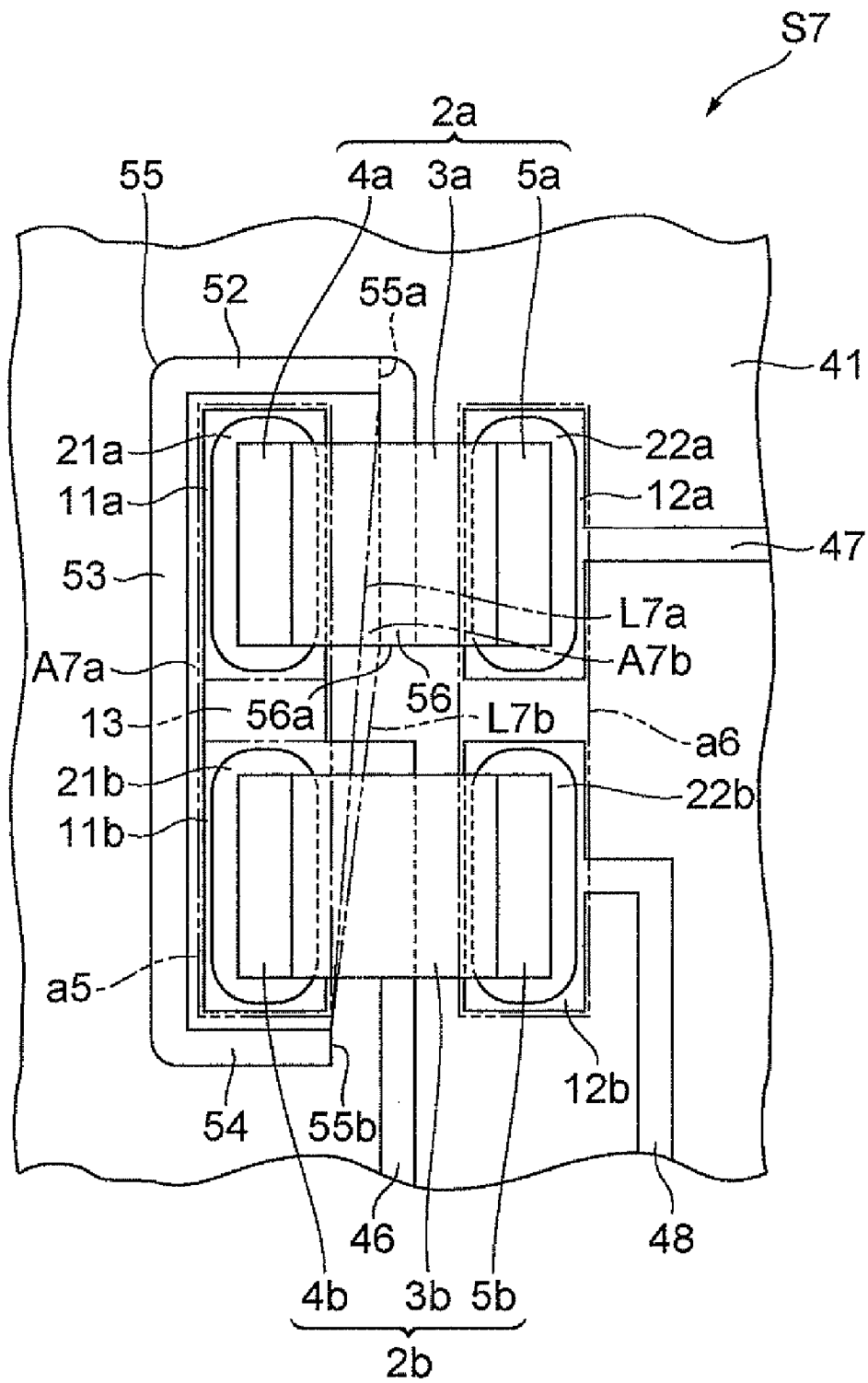
FIG. 8 is a plan view showing an electronic device according to a first modification example of the second embodiment.

FIG. 8 is a plan view showing an electronic device according to the first modification example of the second embodiment. In the electronic device S7 of the first modification example, the shape of slit 55 formed in the circuit board 41 is different from that of the slit 51 in the above embodiment. The straight-line portion 52 of the slit 55 is shorter than that of the slit 51 in the above embodiment. The end of the straight-line portion 52 on the second land 12a side (one end 55a of the slit 55) is located between the other long side of the first land 11a and the other long side of the second land 12a in the facing direction of the first terminal electrode 4a, 4b and the second terminal electrode 5a, 5b (the horizontal direction in FIG. 8). The end of the straight-line portion 54 on the second land 12b side (the other end 55b of the slit 55) reaches a region near the other long side of the first land 11b in the facing direction of the first terminal electrode 4a, 4b and the second terminal electrode 5a, 5b. Therefore, an imaginary straight line L7a connecting the one end 55a and the other end 55b of the slit 55 intersects with the two capacitors 2a, 2b when viewed from the direction perpendicular to the principal surface of the circuit board 41.

As in the above embodiment, the imaginary straight line L7a passes between the two end faces of the capacitor 2a and passes between the two end faces of the capacitor 2b when viewed from the direction perpendicular to the principal surface of the circuit board 41. The imaginary straight line L7a passes the region between the first land 11a and the second land 12a and the region between the first land 11b and the second land 12b. The imaginary straight line L7a passes between the region where the first terminal electrode 4a is fixed to the circuit board 41 and the region where the second terminal electrode 5a is fixed to the circuit board 41. The imaginary straight line L7a passes between the region where the first terminal electrode 4b is fixed to the circuit board 41 and the region where the second terminal electrode 5b is fixed to the circuit board 41.

A slit 56 is formed in the circuit board 41. The slit 56 is so formed that the other end thereof is continuous to the one end 55a of the slit 55 and that it passes between the first land 11a and the second land 12a so as to extend in the direction parallel to the long sides of the first land 11a. The slit 56 extends to near the region between the first land 11a and the first land 11b. An imaginary straight line L7b connecting the one end 56a of the slit 56 and the other end 55b of the slit 55 intersects with the capacitor 2b.

The imaginary straight line L7b passes between the two end faces of the capacitor 2b when viewed from the direction perpendicular to the principal surface of the circuit board 41. The imaginary straight line L7b passes the region between the first land 11b and the second land 12b. The imaginary straight line L7b passes between the region where the first terminal electrode 4b is fixed to the circuit board 41 and the region where the second terminal electrode 5b is fixed to the circuit board 41.

A conductor 13 of a rectangular shape is arranged on the circuit board 41. The conductor 13 is formed integrally with the first land 11a and the first land 11b between the first land 11a and the first land 11b. Conductor patterns 46, 47, and 48 are arranged on the circuit board 41. The conductor pattern 46 is so formed that it is led from the other long side of the first land 11b in the direction perpendicular to the other long side and then extends in the direction parallel to the long side. The conductor pattern 47 is so formed that it extends from one long side of the second land 12a in the direction perpendicular to the one long side. The conductor pattern 48 is so formed that it is led from the other long side of the second land 12b in the direction perpendicular to the other long side and then extends in the direction parallel to the long side.

In the present modification example, the slit 55 is formed in the approximate C-shape so as to open on the side of the region a6 where the two second lands 12a, 12b are formed and surround the region a5 where the two first lands 11a, 11b are formed, in the circuit board 41 and the imaginary straight line L7a connecting the one end 55a and the other end 55b of the slit 55 intersects with the two capacitors 2a, 2b when viewed from the direction perpendicular to the principal surface of the circuit board 41. The slit 56 continuous to the slit 55 is formed in the circuit board 41 and the imaginary straight line L7b connecting the one end 56a of the slit 56 and the other end 55*b* of the slit 55 intersects with the capacitor 2*b* when viewed from the direction perpendicular to the principal surface of the circuit board 41.

In the circuit board 41, a region A7*b* surrounded by the slit 55, the slit 56, and the imaginary straight line L7*b* includes a region A7*a* surrounded by the slit 55 and the imaginary straight line L7*a*, and is more likely to vibrate than the other region of the circuit board. The vibration of the capacitors 2*a*, 2*b* is transferred mainly to the region A7*b* in the circuit board 41.

In the circuit board 41, the region A7*b* vibrates up and down with the imaginary straight line L7*b* side being a fixed end and the side opposite to the imaginary straight line L7*b* being a free end. Since the mainly vibrating portion in the region A7*b* is isolated from the other region of the circuit board 41 by the slits 55, 56, the vibration of the region A7*b* is prevented from being transferred to the region around the region A7*b*. Accordingly, this structure relieves the transfer of the vibration of the capacitors 2*a*, 2*b* to the circuit board 41. As a result, this structure prevents production of audible sound due to the vibration of the board 41.

The first land 11*a* and the region where the first terminal electrode 4*a* is fixed to the circuit board 41 are located within the regions A7*a*, A7*b*. The region where the first terminal electrode 4*a* is fixed to the circuit board 41 is isolated from the region where the second terminal electrode 5*a* is fixed to the circuit board 41, by the slit 56. Therefore, the vibration of the capacitor 2*a* is efficiently transferred to the interior of the region A7*b* in the circuit board 41, whereby the vibration is prevented from being transferred to the region outside the region A7*b*. The vibration transferred to the circuit board 41 is concentrated in the region A7*b*, whereby the vibration of the circuit board 41 is relieved by the slits 55, 56.

The first land 11*b* and the region where the first terminal electrode 4*b* is fixed to the circuit board 41 are located within the regions A7*a*, A7*b*. The second land 12*b* and the region where the second terminal electrode 5*b* is fixed to the circuit board 41 are located outside the regions A7*a*, A7*b*. For this reason, the capacitor 2*b* is so arranged that the second terminal electrode 5*b* is fixed to the other region of the circuit board 41 and that the first terminal electrode 4*b* vibrates relative to the other region of the circuit board 41 and the second terminal electrode 5*b*. Therefore, the vibration transferred to the regions A7*a*, A7*b* in the circuit board 41 is prevented from being transferred to the region outside the regions A7*a*, A7*b*. The vibration transferred to the circuit board 41 is concentrated in the regions A7*a*, A7*b*, whereby the vibration of the circuit board 41 is relieved by the slit 55.

Second Modification Example of Second Embodiment

Figure 9:
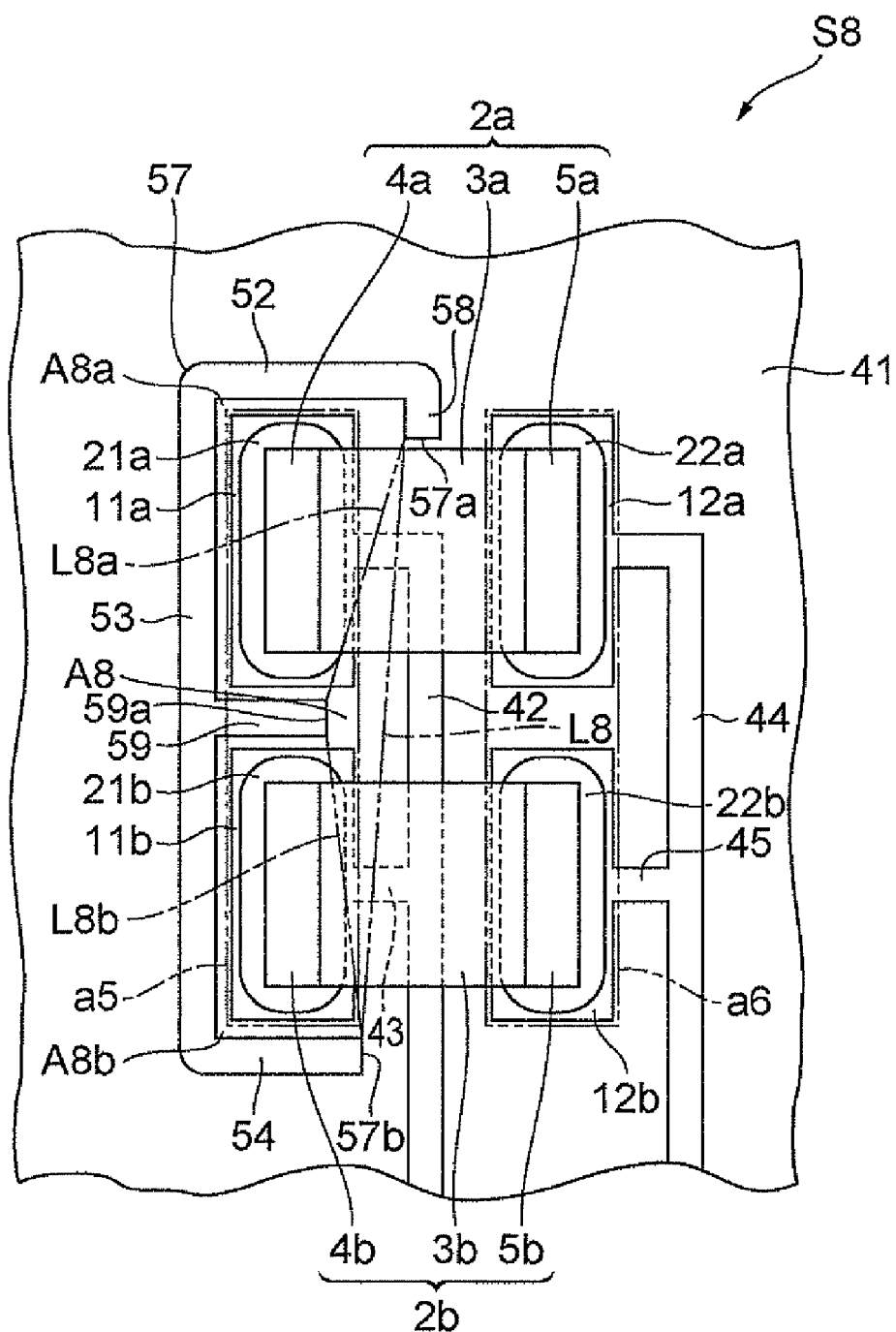
FIG. 9 is a plan view showing an electronic device according to a second modification example of the second embodiment.

FIG. 9 is a plan view showing an electronic device according to the second modification example of the second embodiment. In the electronic device S8 of the second modification example, the shape of slit 57 formed in the circuit board 41 is different from that of the slit 51 in the above embodiment. A slit portion 58 is formed in the circuit board 41. The slit portion 58 extends so as to project from the end of the straight-line portion 52 of the slit 57 into the region between the first land 11*a* and the second land 12*a*. The tip of the slit portion 58 becomes one end 57*a* of the slit 57. An imaginary straight line L8 connecting the one end 57*a* of the slit 57 and the other end 57*b* of the slit 57 intersects with the two capacitors 2*a*, 2*b* when viewed from the direction perpendicular to the principal surface of the circuit board 41.

For this reason, in the circuit board 41, a region A8 surrounded by the slit 57 and the imaginary straight line L8 is more likely to vibrate than the other region of the circuit board 41. The vibration of the capacitors 2*a*, 2*b* is transferred mainly to the region A8 in the circuit board 41. Therefore, this structure prevents production of audible sound due to the vibration of the circuit board 41 as described above.

In the present modification example, a slit 59 of a linear shape is further formed in the circuit board 41. The slit 59 is formed so as to be located between the first land 11*a* and the first land 11*b* and extend in the direction parallel to the short sides of the first lands 11*a*, 11*b*. One end of the slit 59 is connected to the straight-line portion 53, and the slit 59 and the slit 57 are integrally formed. The other end 59*a* of the slit 59 is located between the center and the other long side of the first lands 11*a*, 11*b* in the facing direction of the first terminal electrodes 4*a*, 4*b* and the second terminal electrodes 5*a*, 5*b* (the horizontal direction in FIG. 9).

A first slit of an approximate C-shape opening on the second land 12*a* side is formed by the straight-line portion 52, a part of the straight-line portion 53, and the straight-line portion 59. An imaginary straight line L8*a* connecting the one end 57*a* of the first slit and the other end 59*a* (the tip of slit 59) intersects with the capacitor 2*a* when viewed from the direction perpendicular to the principal surface of the circuit board 41.

A region A8*a* surrounded by the aforementioned first slit and imaginary straight line L8*a* is included in the region A8 and is more likely to vibrate than the other region of the circuit board 41. The vibration of the capacitor 2*a* is transferred mainly to the region A8*a* in the circuit board 41. Therefore, the vibration transferred from the capacitor 2*a* to the region A8*a* in the circuit board 41 is prevented from being transferred to the region outside the region A8*a*. The vibration transferred to the circuit board 41 is concentrated in the region A8*a*, whereby the vibration of the circuit board 41 is relieved by the slits 57, 59.

A second slit of an approximate C-shape opening on the second land 12*b* side is formed by the straight-line portion 54, a part of the straight-line portion 53, and the straight-line portion 59. An imaginary straight line L8*b* connecting the other end 57*b* of the second slit and the other end 59*a* intersects with the capacitor 2*b* when viewed from the direction perpendicular to the principal surface of the circuit board 41.

A region A8*b* surrounded by the second slit and the imaginary straight line L8*b* is included in the region A8 and is more likely to vibrate than the other region of the circuit board 41. The vibration of the capacitor 2*b* is transferred mainly to the region A8*b* in the circuit board 41. Therefore, the vibration transferred from the capacitor 2*b* to the region A8*b* in the circuit board 41 is prevented from being transferred to the region outside the region A8*b*. The vibration transferred to the circuit board 41 is concentrated in the region A8*b*, whereby the vibration of the circuit board 41 is relieved by the slits 57, 59.

Third Modification Example of Second Embodiment

Figure 10:
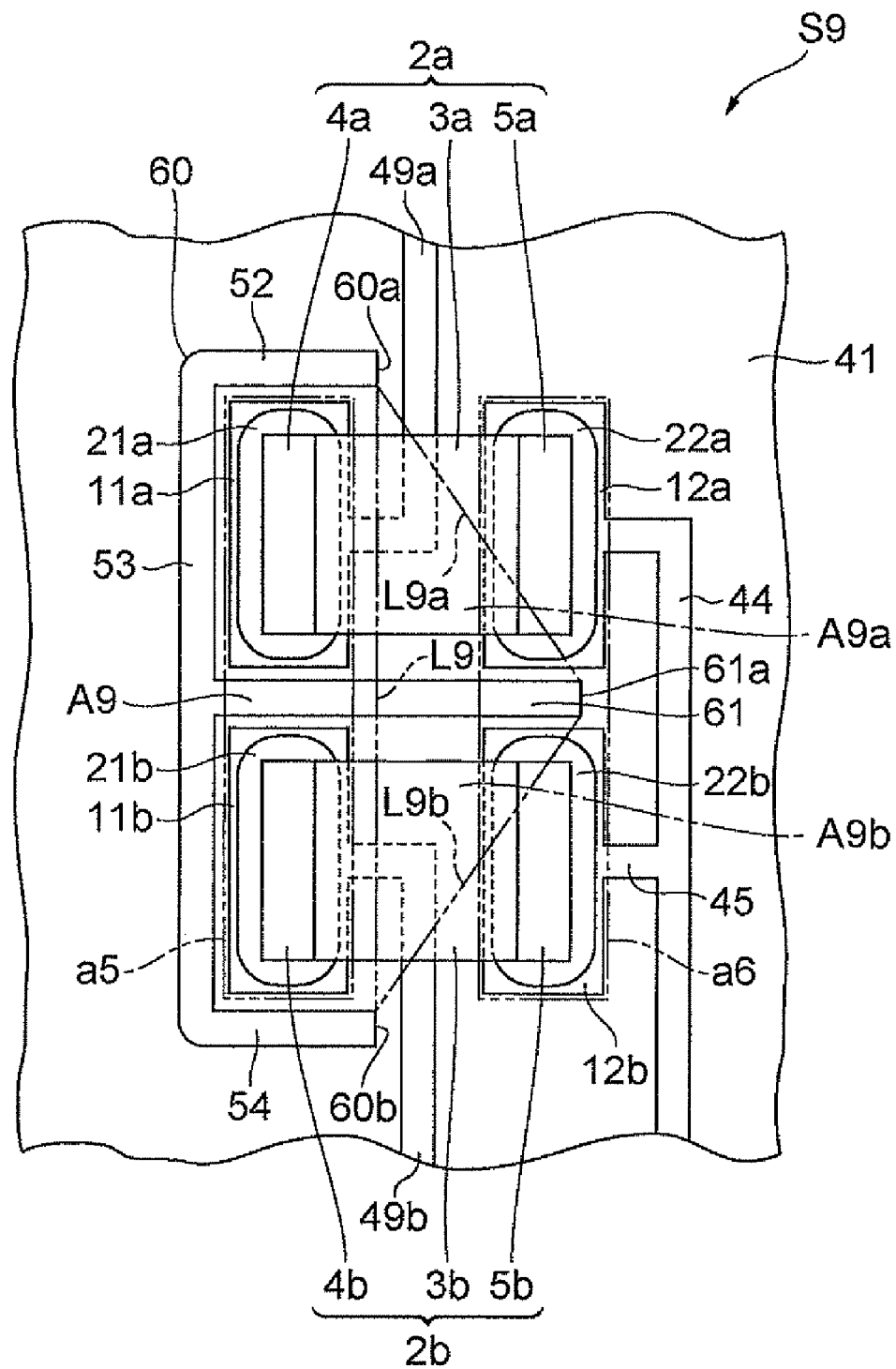
FIG. 10 is a plan view showing an electronic device according to a third modification example of the second embodiment.

FIG. 10 is a plan view showing an electronic device according to the third modification example of the second embodiment. In the electronic device S9 of the third modification example, the shape of slit 60 formed in the circuit board 41 is different from that of the slit 51 in the above embodiment. The tip of the straight-line portion 52 of the slit 60 (one end 60*a* of slit 60) is located between the first land 11*a* and the second land 12*a* in the facing direction of the first terminal electrode 4*a*, 4*b* and the second terminal electrode 5*a*, 5*b* (the horizontal direction in FIG. 10). The tip of the straight-line portion 54 of the slit 60 (the other end 60b of slit 60) is located between the first land 11b and the second land 12b in the facing direction of the first terminal electrode 4a, 4b and the second terminal electrode 5a, 5b.

An imaginary straight line L9 connecting the one end 60a and the other end 60b of the slit 60 intersects with the two capacitors 2a, 2b when viewed from the direction perpendicular to the principal surface of the circuit board 41. For this reason, in the circuit board 41, a region A9 surrounded by the slit 60 and the imaginary straight line L9 is more likely to vibrate than the other region of the circuit board 41. The vibration of the capacitors 2a, 2b is transferred mainly to the region A9 in the circuit board 41. Therefore, this structure prevents production of audible sound due to the vibration of the circuit board 41 as described above.

In the present modification example, a slit 61 of a linear shape is further formed in the circuit board 41. The slit 61 is formed so as to be located between the first land 11a and the first land 11b and extend in the direction parallel to the short sides of the first lands 11a, 11b. One end of the slit 61 is connected to the straight-line portion 53, and the slit 61 and the slit 60 are integrally formed. The other end 61a of the slit 61 is located between the center and one long side of the second lands 12a, 12b in the facing direction of the first terminal electrode 4a, 4b and the second terminal electrode 5a, 5b.

A first slit of an approximate C-shape opening on the second land 12a side is formed by the straight-line portion 52, a part of the straight-line portion 53, and the slit 61. An imaginary straight line L9a connecting the one end 60a of the first slit and the other end 61a (the tip of slit 61) intersects with the capacitor 2a when viewed from the direction perpendicular to the principal surface of the circuit board 41.

A region A9a surrounded by the first slit and the imaginary straight line L9a is more likely to vibrate than the other region of the circuit board 41. The vibration of the capacitor 2a is transferred mainly to the region A9a in the circuit board 41. Therefore, the vibration transferred from the capacitor 2a to the region A9a in the circuit board 41 is prevented from being transferred to the region outside the region A9a. The vibration transferred to the circuit board 41 is concentrated in the region A9a, whereby the vibration of the circuit board 41 is relieved by the slits 60, 61.

A second slit of an approximate C-shape opening on the second land 12b side is formed by the straight-line portion 54, a part of the straight-line portion 53, and the slit 61. An imaginary straight line L9b connecting the other end 60b of the second slit and the other end 61a intersects with the capacitor 2b when viewed from the direction perpendicular to the principal surface of the circuit board 41.

The region A9b surrounded by the second slit and the imaginary straight line L9b is more likely to vibrate than the other region of the circuit board 41. The vibration of the capacitor 2b is transferred mainly to the region A9b in the circuit board 41. Therefore, the vibration transferred from the capacitor 2b to the region A9b in the circuit board 41 is prevented from being transferred to the region outside the region A9b. The vibration transferred to the circuit board 41 is concentrated in the region A9b, whereby the vibration of the circuit board 41 is relieved by the slits 60, 61.

In the present modification example, a conductor pattern 49a and a conductor pattern 49b are arranged on the circuit board 41. The conductor pattern 49a is so formed in an approximate L-shape that it is led from almost the center of the other long side of the first land 11a in the direction perpendicular to the long side and then extends in the direction parallel to the long side. The conductor pattern 49b is so formed in an approximate L-shape that it is led from almost the center of the other long side of the first land 11b in the direction perpendicular to the long side and then extends in the direction parallel to the long side.

The above described the preferred embodiments of the present invention, but it should be noted that the present invention does not always have to be limited to the above-described embodiments and that the present invention can be modified in various ways without departing from the scope of the invention.

In the above embodiments, the slit 31, 35, 36, 38, 51, 55, 57, 60 was formed so as to penetrate the circuit board 1, 41, but these slits may be formed in a groove shape, without penetrating the circuit board 1, 41. In this case, a region surrounded by the slit and the imaginary straight line connecting the one end and the other end of the slit is more likely to vibrate than the other region of the circuit board. Therefore, the vibration of the capacitor is transferred through the first land surrounded by the slit, mainly to the surrounded region, whereby the foregoing region mainly vibrates. Since the slit is formed, the vibration is unlikely to be transferred from the region surrounded by the slit and the imaginary straight line, to the other region of the circuit board, whereby the vibration of the region surrounded by the slit and the imaginary straight line is prevented from being transferred to the other region of the circuit board. Therefore, the vibration of the circuit board due to the capacitor is relieved.

In the above embodiments, the slit 31, 35, 36, 38, 51, 55, 57, 60 was formed in the approximate C-shape by the three portions of the linear shape, but the slit does not have to be limited to it. The slit may also be formed by three portions of a curved shape, and may surround the region where the first land or the plurality of first lands are formed, in an approximate C-shape. The slit may also be a discontinuous one.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An electronic device comprising:
   a multilayer capacitor formed in a nearly rectangular parallelepiped shape and having a first terminal electrode and a second terminal electrode arranged at respective ends thereof; and
   a circuit board having a first land and a second land arranged thereon, in which the first terminal electrode of the capacitor is fixed to the first land and in which the second terminal electrode is fixed to the second land,
   wherein the circuit board has a slit having a C shape with two ends formed so as to open toward the second land side and surround the first land, when viewed from a direction perpendicular to a principal surface of the circuit board,
   wherein the slit is not formed between the first land and the second land in plan view, and no slit is formed between the first land and the second land in plan view,
   wherein an imaginary straight line connecting one end and the other end of the slit intersects with the capacitor when viewed from the direction perpendicular to the principal surface of the circuit board,
   wherein a first region of the circuit board surrounded by the slit and the imaginary straight line is configured to vibrate in the direction perpendicular to the principal surface of the circuit board, and has a side defined by the imaginary straight line and is free to vibrate relative to the circuit board, wherein a second region outside the first region has a side defined by the imaginary straight line and is fixed relative to the circuit board, and wherein the second terminal electrode is fixed to the second region, the first terminal electrode vibrates relative to the second region and the second terminal electrode, and the second terminal electrode is configured to not vibrate relative to the second region or the circuit board.

2. The electronic device according to claim 1, wherein, when viewed from the direction perpendicular to the principal surface of the circuit board, the slit has a first portion located on the side opposite to the second land with respect to the first land, and second and third portions located so as to sandwich the first land in a direction substantially perpendicular to a facing direction of the first terminal electrode and the second terminal electrode.

3. The electronic device according to claim 2, wherein the slit is formed so that the first portion is continuous to the second and third portions.

4. The electronic device according to claim 1, the electronic device comprising a plurality of said capacitors, wherein the plurality of capacitors are juxtaposed so that the facing directions of the first terminal electrode and the second terminal electrode thereof are parallel to each other, wherein the circuit board has a third region in which there are the first lands arranged in a number corresponding to a number of capacitors, and a fourth region in which there are the second lands arranged in a number corresponding to the number of capacitors, wherein the slit is formed so as to open towards the fourth region side and surround the third region, when viewed from the direction perpendicular to the principal surface of the circuit board, and wherein the imaginary straight line intersects with the plurality of capacitors when viewed from the direction perpendicular to the principal surface of the circuit board.

5. The electronic device according to claim 4, wherein, when viewed from the direction perpendicular to the principal surface of the circuit board, the slit has a first portion located on the side opposite to the fourth region with respect to the third region, and second and third portions located so as to sandwich the third region in a direction substantially perpendicular to the facing directions of the first terminal electrode and the second terminal electrode.

6. The electronic device according to claim 5, wherein the slit is formed so that the first portion is continuous to the second and third portions.

7. The electronic device according to claim 4, wherein the slit is formed so as to extend between the first lands adjacent to each other.

8. The electronic device according to claim 1, wherein the slit is discontinuously formed, and wherein the circuit board has a conductor pattern arranged thereon, the conductor pattern being electrically connected to the first land and passing a discontinuous portion of the slit.

* * * * *